United States Patent [19]
Pascucci et al.

[11] Patent Number: 5,602,786
[45] Date of Patent: Feb. 11, 1997

[54] METHOD FOR PROGRAMMING REDUNDANCY REGISTERS IN A COLUMN REDUNDANCY INTEGRATED CIRCUITRY FOR A SEMICONDUCTOR MEMORY DEVICE, AND COLUMN REDUNDANCY INTEGRATED CIRCUITRY

[75] Inventors: Luigi Pascucci, Giovanni; Marco Olivo, Bergamo, both of Italy

[73] Assignee: SGS-Thomson Microelectronics S.r.l., Agrate Brianza, Italy

[21] Appl. No.: 389,599

[22] Filed: Feb. 16, 1995

[30] Foreign Application Priority Data

Feb. 17, 1994 [EP] European Pat. Off. .............. 94830061

[51] Int. Cl.$^6$ .................................................. G11C 7/00
[52] U.S. Cl. ............... 365/200; 365/185.09; 365/185.11; 365/189.07; 365/230.03; 365/230.02; 371/10.2; 371/10.3
[58] Field of Search .......................... 365/185.09, 185.11, 365/189.07, 200, 225.7, 230.03, 230.02; 371/10.2, 10.3

[56] References Cited

U.S. PATENT DOCUMENTS 5,272,672  12/1993  Ogihara .................................. 365/200

FOREIGN PATENT DOCUMENTS

| 0074305 | 3/1983 | European Pat. Off. | G06F 11/20 |
| 0472209 | 2/1992 | European Pat. Off. | G06F 11/20 |
| 0655743 | 5/1995 | European Pat. Off. | G11C 16/06 |
| 0657814 | 6/1995 | European Pat. Off. | G06F 11/20 |
| 0661636 | 7/1995 | European Pat. Off. | G06F 11/20 |
| 0668563 | 8/1995 | European Pat. Off. | G06F 11/20 |

Primary Examiner—Viet Q. Nguyen
Assistant Examiner—Andrew Q. Tran
Attorney, Agent, or Firm—David V. Carlson; Harry K. Ahn; Seed and Berry LLP

[57] ABSTRACT

A method for programming redundancy registers in a column redundancy integrated circuitry for a semiconductor memory device with columns of memory elements grouped together to form portions of a bi-dimensional array of memory elements. The column redundancy circuitry comprises a plurality of non-volatile memory registers wherein each register is associated with a respective redundancy column of redundancy memory elements and each register is programmable to store an address of a defective column and an identifying code for identifying the portion of the bi-dimensional array to which the defective column belongs. When being programmed, each non-volatile memory register is supplied with column address signals and with a first subset of row address signals. The column address signals carry the address of a defective column and the first subset of row address signals carry the identifying code. One signal of a second subset of the row address signals is used to select one non-volatile memory register among the plurality of registers such that the defective column address and the identifying code carried by the column address signals and by the first subset of the row address signals are programmed into the selected non-volatile memory register. Using existing column and row address lines to program the redundancy memory registers reduces the need to generate dedicated on-chip signals, thereby minimizing the size of the memory device.

17 Claims, 4 Drawing Sheets

METHOD FOR PROGRAMMING REDUNDANCY REGISTERS IN A COLUMN REDUNDANCY INTEGRATED CIRCUITRY FOR A SEMICONDUCTOR MEMORY DEVICE, AND COLUMN REDUNDANCY INTEGRATED CIRCUITRY

TECHNICAL FIELD

The present invention relates to a method for programming redundancy registers in a column redundancy integrated circuitry for a semiconductor memory device, and to a column redundancy integrated circuitry actuating such method.

BACKGROUND OF THE INVENTION

Semiconductor memory devices are generally organized in a bi-dimensional array (memory matrix) wherein the memory elements are located at the intersection of rows ("word lines") and columns ("bit lines") of the matrix: to access a given memory element, it is necessary to select the word line and the bit line at the intersection of which said memory element is located; to this purpose, the memory address bus is divided into row and column address signals, which are decoded independently.

In byte- or word-organized memories, having a data bus comprising respectively eight or sixteen bits, each bit in the data bus is associated with a portion of the memory matrix which comprises a group of said bit lines; each logic configuration of the column address signals causes the simultaneous selection of one bit line in each group. Each group of bit lines is associated with a respective sensing circuitry for reading the information stored in the memory matrix elements which belong to said portion of the memory matrix.

It is known that in the manufacture of semiconductor memories, defects are frequently encountered that afflict a limited number of memory elements in the memory matrix. The high probability of defects of this type arises because, in a semiconductor memory device, the greatest part of the chip area is occupied by the memory matrix; moreover, it is in the memory matrix, and not in the peripheral circuitry, that the manufacturing process characteristics are usually pushed to limits.

In order to prevent rejection of an entire chip due to the presence of a limited number of defective memory elements among many millions of memory elements, and therefore to increase the manufacturing process yield, the technique is known of providing for the manufacture of a certain number of additional memory elements, commonly called "redundancy memory elements," to be used as a replacement of those elements that, during testing of the memory device, prove defective. The selection circuits, with which the integrated component must necessarily be provided, and which allow the above-mentioned functional replacement of a defective memory element with a redundancy memory element are indicated as a whole with the name of "redundancy circuitry," while the set of redundancy memory elements and circuitry is defined as "redundancy."

The redundancy circuitry comprises programmable non-volatile memory registers (redundancy registers) suitable to store those address configurations corresponding to the defective memory elements; such registers are programmed once during the memory device testing, and must retain the information stored therein even in absence of the power supply.

In practical implementations of redundancy in memory devices, both word lines and bit lines of redundancy memory elements are generally provided in the memory matrix; each redundancy word line or bit line is associated with a respective redundancy register, wherein the address of a defective word line or bit line is stored so that, whenever the defective word line or bit line is addressed, the corresponding redundancy word line or bit line is selected.

Each redundancy register comprises programmable non-volatile memory cells wherein the address of a defective word- or bit-line can be programmed; each one of such memory cells must comprise at least one programmable non-volatile memory element, such as a fuse or a floating-gate MOSFET, a load circuit for reading the information stored therein, and a program load circuit for the programming of the memory element according to the logic state of a respective address bit in the row or column address signal set. In European Patent Application No. 93830474.8, incorporated herein by reference, provided as background and not admitted as prior art, a program load circuit for the programming of a memory cell in a non-volatile memory register (such as a redundancy register) is described in which the datum to be programmed into the memory element of the memory cell can be directly supplied by one of the address signal lines already present in the memory device for supplying the decoding circuitry, without the need of generating additional signals.

In European Patent Application No. 93830528.1, incorporated herein by reference, provided as background and not admitted as prior art, a redundancy circuitry for a byte- or word-organized memory device is described wherein each redundancy register not only stores the column address of a defective bit line, but also an identifying code for identifying the portion of the memory matrix wherein said defective bit line has been found. As a result, when a defective bit line in a given matrix portion is found, it can be individually replaced by a redundancy bit line, without causing the replacement to occur for all the bit lines in the remaining matrix portions that have the same column address of the defective bit line.

However, when a redundancy register is to be programmed to store the address of a defective bit line, it is necessary to select the redundancy register from among all those available in the redundancy circuitry, and to supply the selected redundancy not only with the column address signals, but also with signals carrying the identifying code of the memory matrix portion to which the defective bit line belongs.

SUMMARY OF THE INVENTION

One object of the present invention is to provide a method for programming redundancy registers in a column redundancy integrated circuitry of the type described in European Patent Application No. 93830528.1, which makes use as far as possible of signal lines already existent in the memory device for different purposes, without the need of generating dedicated on-chip signals and thus minimizing the memory device chip size.

Another object of the present invention is to realize a column redundancy integrated circuitry implementing the above-mentioned method.

According to one embodiment of the present invention, such main object is attained by means of a method for programming redundancy registers in a column redundancy integrated circuitry for a semiconductor memory device with memory elements located at the intersection of rows and columns of at least one bi-dimensional array of memory elements, the columns being grouped together to form portions of the bi-dimensional array. The column redundancy circuitry comprises a plurality of nonvolatile memory registers wherein each non-volatile memory register is associated with a respective redundancy column of redundancy memory elements and each non-volatile memory register is programmable to store an address of a defective column and to store an identifying code for identifying the portion of the bi-dimensional array to which the defective column belongs. The method provides for supplying each non-volatile memory register with column address lines carrying the defective column address and with a first subset of a set of row address lines carrying the identifying code. Then one signal among a second subset of the set of row address lines is activated to select one non-volatile memory register of the plurality of memory registers such that the data carried by the column address lines and by the first subset of row address lines are programmed into the selected non-volatile memory register.

According to another embodiment of the present invention, the other object is attained by means of a column redundancy integrated circuitry for a semiconductor memory device, the column redundancy integrated circuitry comprising first supply means and second supply means for supplying each non-volatile memory register respectively with column address signals and with a first subset of a set of the row address signals, which, when one of the non-volatile memory registers is to be programmed, carry the address of a defective column and the identifying code respectively. The column redundancy integrated circuitry further comprises programming selection means supplied with the second subset of the set of row address signals, each signal of the second subset being associated with a respective non-volatile memory register of the plurality of memory registers to cause, when activated, the data, carried by the column address signals and by the first subset of row address signals, to be programmed into the respective associated non-volatile memory register.

By virtue of the present invention, programming of the redundancy registers can be carried out by using already existing signals, i.e., address signals normally used to address the memory elements when reading the memory device.

DETAILED DESCRIPTION OF THE INVENTION

In the following, reference will be made to a word-organized memory device, having, as previously described, a data bus of sixteen bits, with memory elements located at the intersection of rows (word lines) and columns (bit lines) of a bi-dimensional array or memory matrix; the memory matrix is ideally divided into portions constituted by groups of bit lines, each portion representing the memory space associated with one bit in the data bus. Such architecture is well known to anyone skilled in the art, and is, for example, described in European Patent Application No. 93830528.1, incorporated herein for reference. A row redundancy circuitry is described in European Patent Application No. 94830062.9. This application is incorporated herein by reference.

Figure 1:
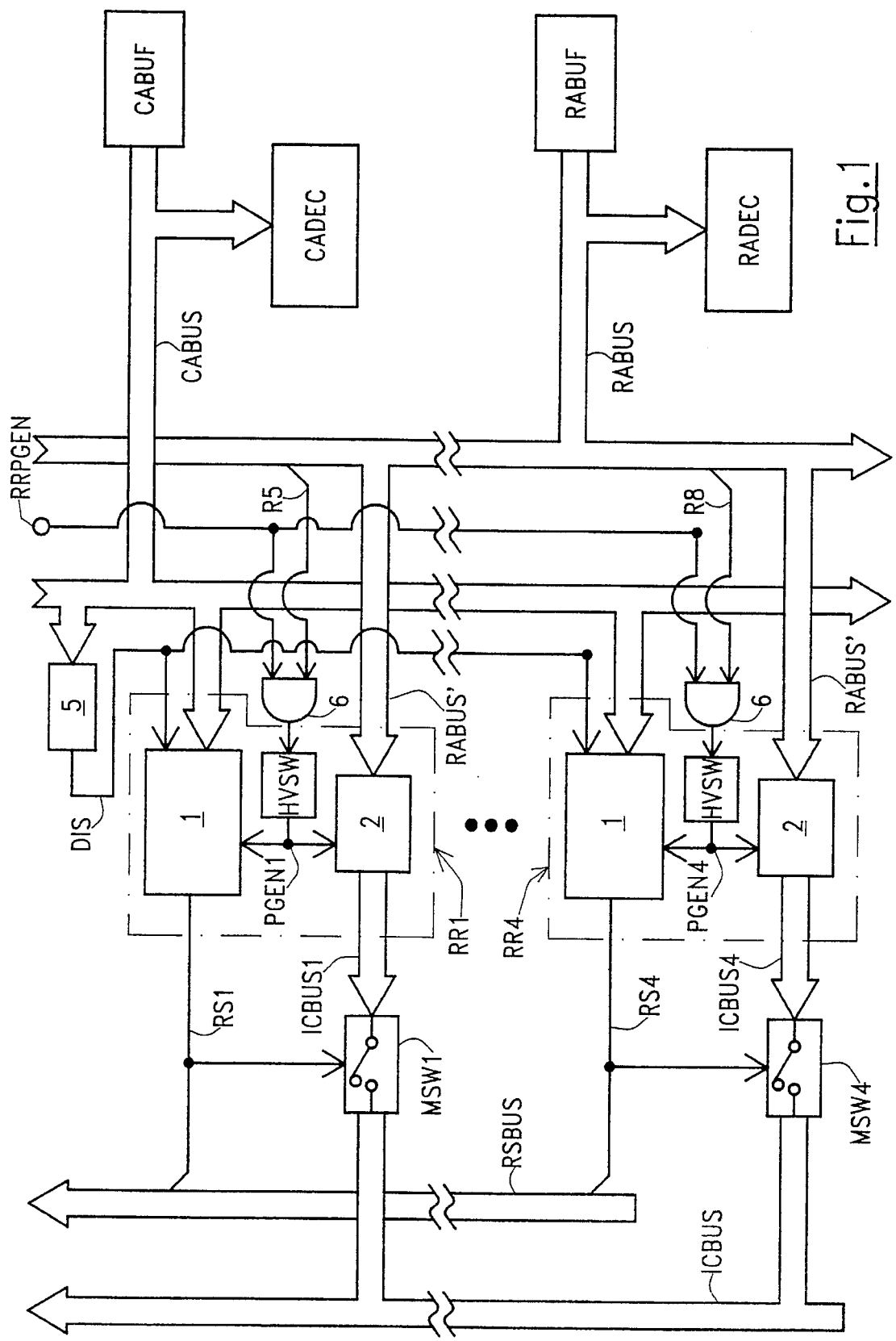
FIG. 1 is a schematic electrical diagram of a column redundancy integrated circuitry according to a first embodiment of the present invention.

In FIG. 1 a column redundancy circuitry according to a first embodiment of the invention is shown; the circuitry comprises a plurality (four, in the shown example) of programmable non-volatile memory registers or redundancy registers RR1–RR4, each one suitable to store an address of a defective bit line (not shown) which must be replaced by a redundancy bit line (not shown).

As described in previously cited European Patent Application No. 3830528.1, each redundancy register RR1–RR4 is substantially made up of a first part, represented in FIG. 1 by a block 1, wherein the address of a defective bit line can be programmed, and of a second part, represented in FIG. 1 by a block 2, suitable to store in a coded form an information suitable to determine in which portion of the memory matrix (i.e., in which group of bit lines) the defective bit line whose address is stored in block 1 has been found.

Figure 2:
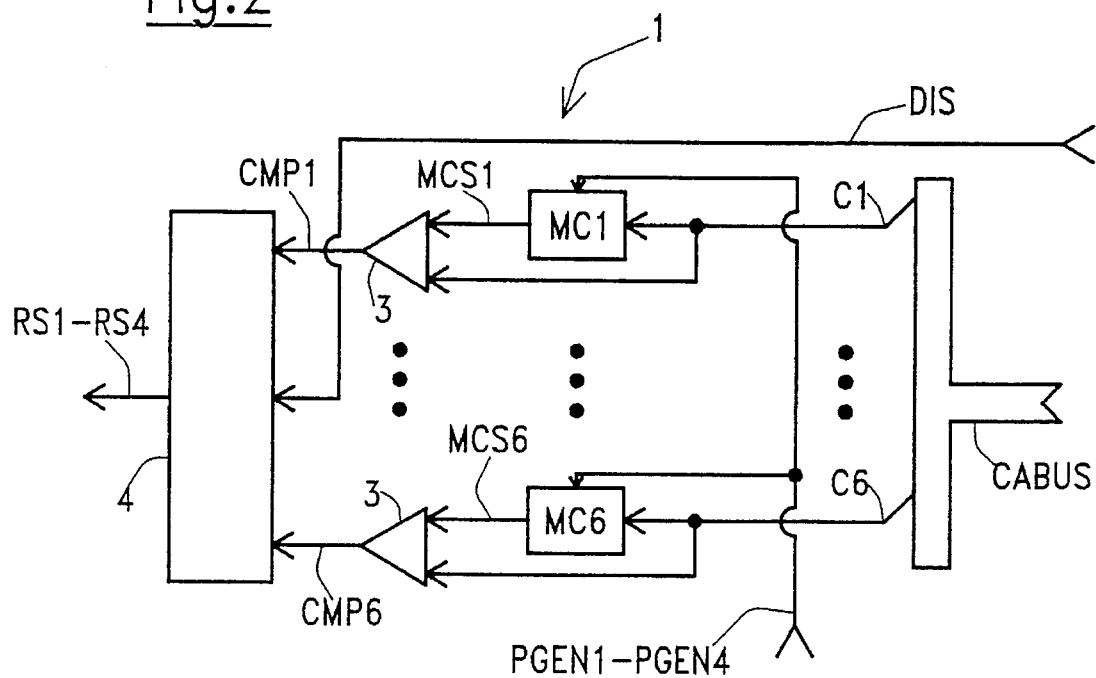
FIG. 2 is a schematic electrical diagram of a first part of a non-volatile memory register of the column redundancy circuitry of FIG. 1.

As shown in FIG. 2, the block 1 comprises a number of programmable non-volatile memory cells MC1–MC6 equal to the number of column address signals C1–C6 in a column address bus CABUS supplying all the redundancy registers RR1–RR4. The column address bus CABUS is generated by a column address input buffer circuitry CABUF and also supplies in a per-se known way a column decoding circuitry CADEC for the selection of bit lines of the memory matrix. Each memory cell MC1–MC6 is supplied with a respective column address signal C1–C6, for the reasons which will be explained later; each memory cell MC1–MC6 has an output signal MCS1–MCS6, representing the memory cell status, which is supplied, together with the respective column address signal C1–C6, to a respective comparator 3 whose output signal CMP1–CMP6 is activated only when the memory cell status coincides with the current state of the respective column address signal; since the comparator 3 deals with digital signals, it can be simply represented by an AND gate. All the signals CMP1–CMP6 supply a redundancy bit line selection circuit 4 which, when all the signals CMP1–CMP6 are activated (i.e., when the current state of the column address signals C1–C6 coincides with the logic state stored in the memory cells MC1–MC6, which means that a defective column address is supplied to the memory device) activates a respective redundancy bit line selection signal RS1–RS4. The redundancy bit line selection at circuitry 4 can be implemented by any one of the more known prior art circuits for such.

As described in European Patent Application No. 93830491.2 and also in U.S. patent application Ser. No. 08/349,783, entitled "Redundancy Circuitry for a Semiconductor Matrix," filed on Dec. 6, 1994 by inventors Luigi Pascucci and Carlo M. Golla, and incorporated herein by reference, it is necessary to prevent ambiguous bit line selection to occur: since in fact even non-programmed redundancy registers, associated with unused redundancy bit lines, store a particular logic state which belongs to the set of all the possible states for the column address signals C1–C6, when a column address is supplied to the memory device which coincides with said particular logic state the redundancy bit lines associated with all the non-programmed redundancy registers would be simultaneously selected. This is clearly unacceptable, and the selection of the redundancy bit lines must be inhibited whenever a column address is supplied to the memory device which coincides with said particular logic state (which is well known, since it corresponds to the non-programmed or virgin condition of the memory cells MC1–MC6). To this purpose, a combinatorial circuit 5 (FIG. 1) is supplied with the column address bus CABUS to recognize if the current state of the column address signals C1–C6 coincides with said particular logic state, and if this occurs, the circuit 5 activates an inhibition signal DIS which is supplied to the redundancy bit line selection circuits 4 in all the redundancy registers RR1–RR4 (FIG. 2). This prevents the signals RS1–RS4 to be activated even if one or more redundancy registers RR1–RR4 exists which has not been programmed, and which therefore stores in the memory cells MC1–MC6 said particular logic state. The combinatorial circuit 5 can be an element of the column address decoding circuitry CADEC.

Figure 3:
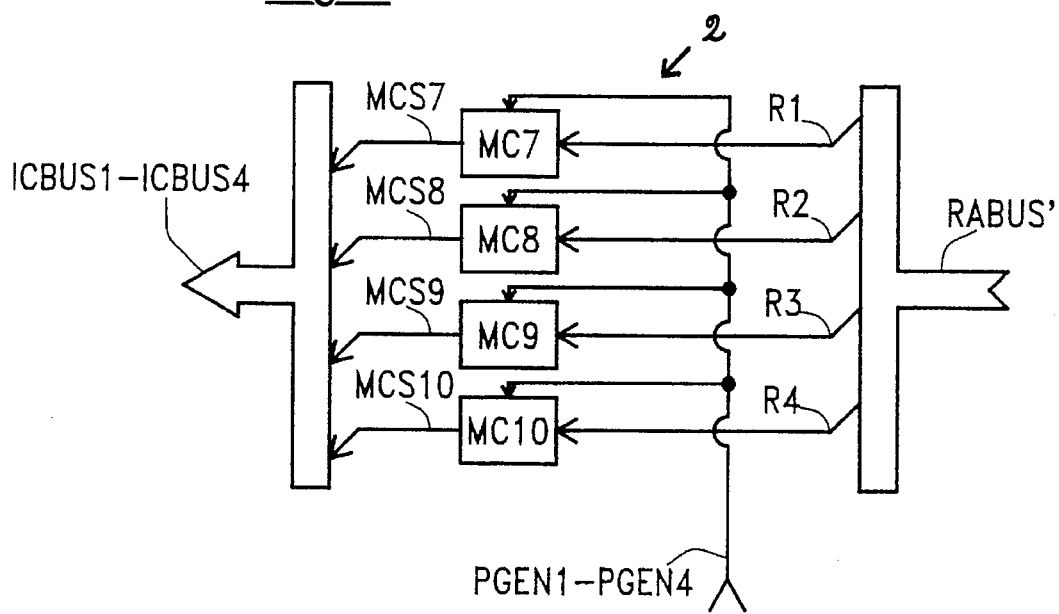
FIG. 3 is a schematic electrical diagram of a second part of said non-volatile memory register.

As shown in FIG. 3, block 2 of each redundancy register RR1–RR4 comprises a number of memory cells MC7–MC10 sufficient to store in coded form an identifying code for identifying the memory matrix portion wherein the defective bit line whose address is stored in the memory cells MC1–MC6 of the same redundancy register RR1–RR4 has been found; in the example shown, referring to a word-organized memory devices with sixteen bits in the data bus, each bit associated with a respective memory matrix portion, a four-bit code is sufficient to identify sixteen different memory matrix portions. The four memory cell status output signals MCS7–MCS10 are grouped together in a local identifying code bus ICBUS1–ICBUS4. The four bus ICBUS1–ICBUS4 are connected to an identifying code bus ICBUS through a respective multiple switch MSW1–MSW4 (a switch with four input channels and four output channels) controlled by the respective redundancy bit line selection signal RS1–RS4. Said signals RS1–RS4 are grouped together in a redundancy selection signal bus RSSBUS.

Figure 4:
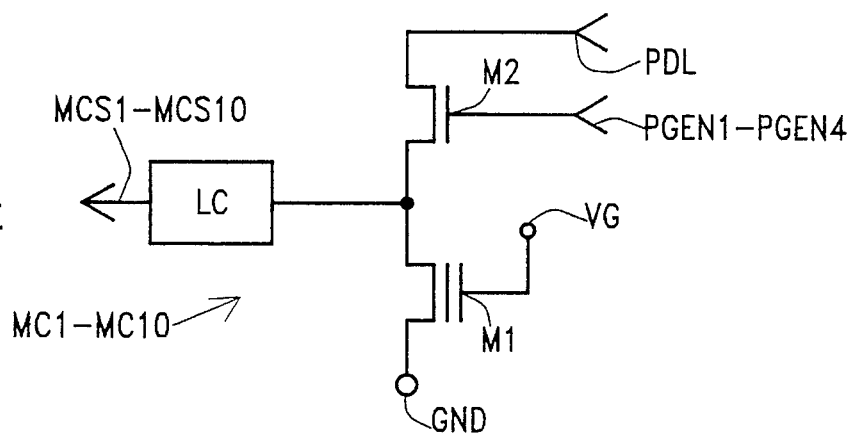
FIG. 4 is a schematic electrical diagram of a programmable non-volatile memory cell of said non-volatile register.

As described in European Patent Application No. 93830474.8, and as shown in FIG. 4, each programmable non-volatile memory cell MC1–MC10 comprises a programmable non-volatile memory element, for example a floating-gate MOSFET M1 with source connected to a ground voltage GND and control gate connected to a supply voltage VG which can be switched from a reading voltage value (typically of 5 V) to a programming high-voltage value (of about 12 V); the drain of M1 is connected to a reading load circuit LC whose output is represented by the signal MCS1–MCS10; the drain of M1 is also connected to a programming load circuit substantially represented by a MOSFET M2 whose drain is connected to a programming data line PDL. In each redundancy register RR1–RR4, the programming data lines PDL of the memory cells MC1–MC6 of the block 1 are each connected to a respective column address signal C1–C6, while the programming data lines PDL of the memory cells MC7–MC10 of the block 2 are each connected to a respective row address signal R1–R4 taken from a row address bus RABUS' which is constituted by a subset of a set of row address signals grouped together to form a row address bus RABUS. The row address bus RABUS is generated by a row address input buffer circuitry RABUF and also supplies in a per-se known way a row decoding circuitry RADEC for the selection of word lines of the memory matrix. In each one of the redundancy registers RR1–RR4, the gate of the MOSFET M2 in all the memory cells MC1–MC10 is connected to an output signal PGEN1–PGEN4 of a respective ground/high-voltage switch HVSW (FIG. 1). The circuit of high voltage switch HVSW is of any acceptable type of the many known in the prior art. Said switch HVSW is controlled by an output signal of a respective two-input AND gate 6, a first input of which is supplied with a redundancy register program enable signal RRPGEN activated by a control circuitry (not shown) generally provided in the memory device, and a second input of the AND gate 6 is supplied with a respective row address signal R5–R8 also taken from the row address bus RABUS. Obviously, the number of signals in the row address bus RABUS must be at least equal to the number of row address signals R1–R8. All the AND gates 6 globally represent a programming selection circuitry.

When during the memory device testing a defective bit line is found in a given memory matrix portion (a situation which can be easily detected since the logic state of the respective bit in the data bus of the memory device does not correspond to the expected one), the defective bit line must be replaced by a redundancy bit line. To this purpose, the address of the defective bit line, as well as the identifying code of the memory matrix portion to which it belongs, must be programmed into one of the redundancy registers RR1–RR4 which is still available (the testing machine keeps memory of the already used redundancy bit lines), for example RR1. The memory device is supplied with a column address corresponding to that of the defective bit line, so that the column address bus CABUS carries the address to be programmed into the memory cells MC1–MC6 of the redundancy register RR1. The memory device is further supplied with a row address such that the row address signals R1–R4 carry in a coded form the identifying code of the memory matrix portion containing the defective bit line, while R5 is a logic "1" and R6–R8 are logic "0", to select the redundancy register RR1 for programming. When the control circuitry activates the signal RRPGEN, the switch HVSW in RR1 drives its output PGEN1 to the programming high voltage value: this causes the MOSFETs M2 in each memory cell MC1–MC10 of RR1 to be on, so that the voltage value present on the respective programming data line PDL is transferred to the drain of the floating-gate transistor M1; the gate voltage VG of all the floating-gate transistors M1 in all the memory cells MC1–MC10 of all the redundancy registers RR1–RR4 is also switched to the programming high voltage by the control circuitry, so that the floating gate transistors M1 can be programmed according to the voltage on their drain. Let's suppose that the defective column belongs to a matrix portion identified by the code "1111", and has an address C1= . . . =C5="1", C6="0": the floating-gate transistors M1 in the memory cells MC1–MC5, MC7–MC10 of RR1 will have a drain voltage corresponding to the high logic level, usually 5 V, and a gate voltage of about 12 V, and will therefore undergo programming, while in the memory cell MC6 of RR1 the drain of M1 will be grounded, and M1 will not undergo programming. In the remaining redundancy registers RR2–RR4 the signal PGEN2–PGEN4 is kept to ground, and the MOSFETs M2 in all their memory cells MC1–MC10 will be off, so that no programming takes place.

When the memory device is operated in a reading condition, when the column address supplied to the memory device is such that C1= . . . =C5="1", C6="0", in RR1 it happens that MCS1=C1, . . . , MCS6=C6, and all the signals CMP1–CMP6 are activated; since the current column address does not cause the signal DIS to be activated, the redundancy selection circuitry 4 in RR1 activates the redundancy selection signal RS1; this causes the multiple switch MSW1 to close, so that the signals MCS7–MCS10 (carrying the identifying code "1111" of the matrix portion containing the defective bit line) of the bus ICBUS1 are transferred to the bus ICBUS that will be decoded to define, for the memory matrix portion identified by the current identifying code, a bit line selection path different from that normally addressing non-defective bit lines; this means that the redundancy selection signal RS1 allows the selection of the redundancy bit line, while the signals in the ICBUS are decoded to inhibit the selection of the defective bit line. It must be emphasized that even if the column address signal configuration C1= . . . =C5="1", C6="0" determines the selection of one bit line in each memory matrix portion, only the defective bit line is deselected and replaced by a redundancy bit line; this is made possible by the fact that in the redundancy register RR1 not only the defective bit line address is stored, but also the identifying code of the matrix portion to which the defective bit line belongs.

Figure 5:
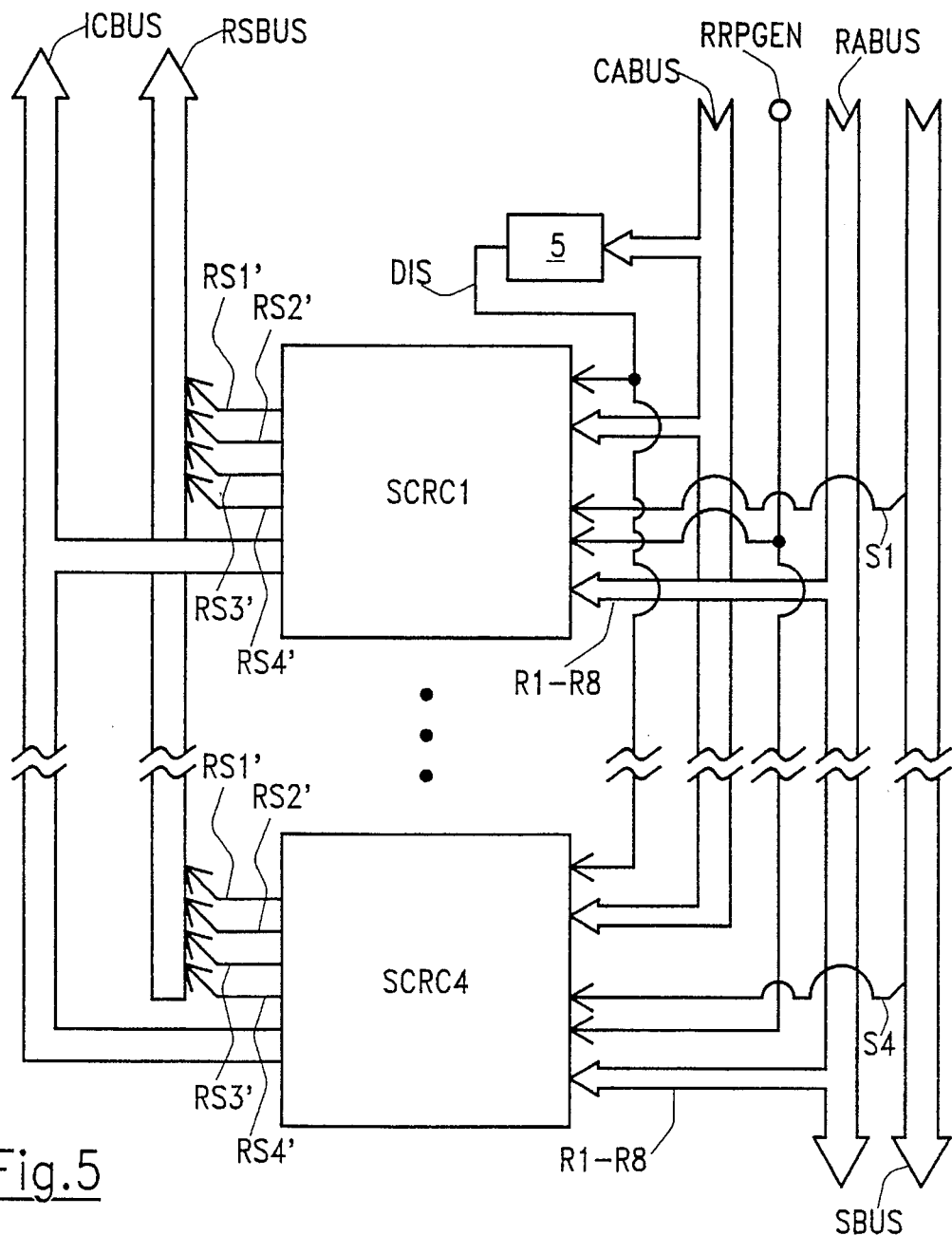
FIG. 5 is a schematic electrical diagram of a column redundancy integrated circuitry according to a second embodiment of the present invention.
Figure 6:
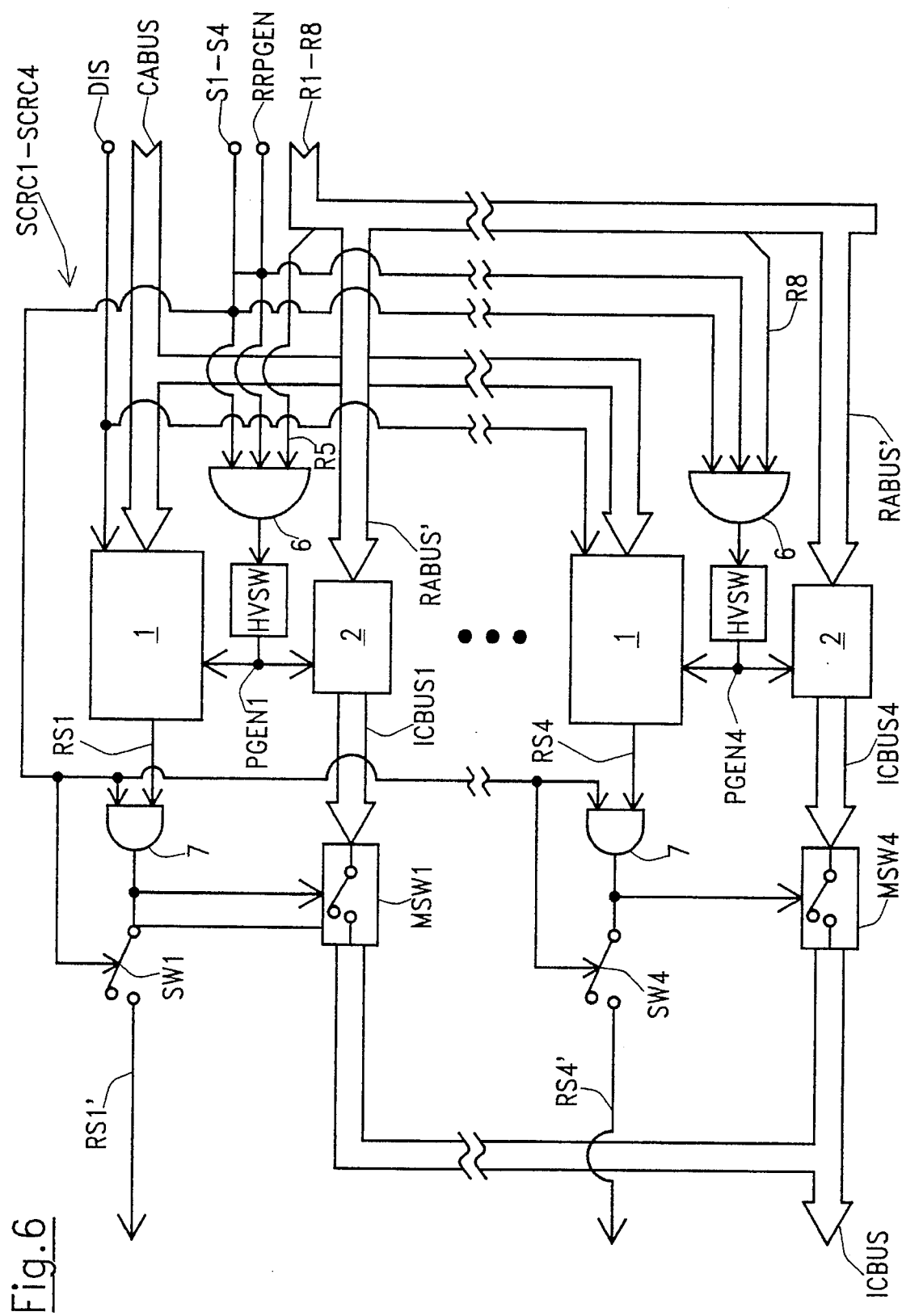
FIG. 6 is a schematic electrical diagram of a part of the column redundancy circuitry of FIG. 5.

A second embodiment of the present invention, shown in FIGS. 5 and 6, is suitable for a memory device in which the memory matrix is divided in sectors which are individually addressable, each sector being further ideally divided in sector portions constituted by groups of bit lines and constituting the sector memory space associated with single bits in the data bus of the memory device. Such architecture is used for example in Flash EEPROM devices. Each sector is provided with respective redundancy bit lines, and to increase the reparability rate defective bit lines in a given sector can be replaced without causing non-defective bit lines in other sectors but having identical column address to be simultaneously replaced. A column redundancy circuitry for such a memory device comprises therefore a number of sector column redundancy circuitries SCRC1–SCRC4 equal to the number of different sectors (four, in the shown example).

As shown in FIG. 6, each sector column redundancy circuitry SCRC1–SCRC4 comprises a plurality of redundancy registers RR1–RR4, for example, four, identical to those previously described. Differently from the previous embodiment, the AND gates 6 have three inputs, two of which are again supplied with the redundancy register program enable signal RRPGEN and with one of the four row address signals R5–R8, while a third input is supplied with a sector selection signal S1–S4 taken from a sector selection signal bus SBUS (all the AND gates 6 in each sector column redundancy circuitry SCRC1–SCRC4 are supplied by the same sector selection signal S1–S4). Further, the redundancy selection signals RS1–RS4 at the output of the redundancy registers RR1–RR4 are not directly grouped together to form the bus RSBUS, but are instead each one supplied to a first input of a respective AND gate 7 whose second input is supplied with the sector selection signal S1–S4 of the sector to which the column redundancy circuitry SCRC1–SCRC4 is associated; the output of each AND gate 7 is then connected to a respective signal RS1'–RS4' of the RSBUS through a respective switch SW1–SW4 controlled by the sector selection signal S1–S4. The multiple switches MSW1–MSW4 are not controlled by the respective signal RS1–RS4 directly, but by the output signal of the AND gate 7, and their closing is thus subjected not only to the activation of the respective signal RS1–RS4, but also to the activation of the sector selection signal S1–S4.

When during the memory device testing a defective bit line is found in a given sector, let's say in the first sector, said defective bit line can be replaced by a redundancy bit line associated with a redundancy register belonging to the sector column redundancy circuitry SCRC1. Supposing that such redundancy register is RR1, programming of the defective bit line address and sector portion identifying code in the redundancy register RR1 requires the activation of the sector selection signal S1 and of the row address signal R5, so that when the control circuitry activates the signal RRPGEN the signal PGEN1 in SCRC1 is driven to the programming voltage value. Programming of the redundancy registers RR2–RR4 in SCRC1 is inhibited by keeping the row address signals R6–R8 low as in the previous embodiment, and programming of the redundancy registers RR1–RR4 in the sector column redundancy circuitries SCRC2–SCRC4 is inhibited by keeping the sector selection signals S2–S4 low.

When the memory device is operated in a reading condition, and the first sector is addressed, when the column address supplied to the memory device coincides with the address stored in RR1 of SCRC1 the signal RS1 is activated. Since only one sector is addressed at a time, of the four sector selection signals S1–S4 only S1 is activated: the switches SW1–SW4 in SCRC1 are therefore closed, while the switches SW1–SW4 in SCRC2–SCRC4 are open, so that the signals RS1'–RS4' of the bus RSBUS are respectively connected to the output signals of the four AND gates 7 in SCRC1.

The output of the AND gate 7 associated with RR1 in SCRC1 is activated; this causes the signals RS1' to be activated, so that the respective redundancy bit line can be selected. Further, the activation of the output signal of the AND gate 7 associated with RR1 in SCRC1 causes the multiple switch MSW1 in SCRC1 to close so that the identifying code stored in RR1 and carried by the local bus ICBUS1 of SCRC1 is transferred to the identifying code bus ICBUS. The remaining multiple switches MSW2–MSW4 in SCRC1, as well as all the multiple switches MSW1–MSW4 in SCRC2–SCRC4, are instead open. As in the previous embodiment, the signals of the bus ICBUS are used to inhibit the selection of the addressed defective bit line.

The detailed discussion provided above describes preferred embodiments of the present invention. This discussion will enable those skilled in the art to make modifications to the described embodiments that do no depart from the spirit and scope of the claimed invention. Accordingly, the present invention contemplates all such modification that read upon the appended claims and equivalents thereof.

We claim:

1. Method for programming redundancy registers in a column redundancy integrated circuitry for a semiconductor memory device with memory elements located at the intersection of rows and columns of a bi-dimensional array of memory elements, the columns being grouped together to form a plurality of portions of the bi-dimensional array, the column redundancy circuitry including a plurality of non-volatile memory registers each one being associated with a respective redundancy column of redundancy memory elements and each one being programmable to store an address of a defective column and to store an identifying code for identifying the portion of the bi-dimensional array to which the defective column belongs, the method comprising the steps of:

supplying each non-volatile memory register with column address signals carrying a defective column address;

supplying each non-volatile memory register with a first subset of a set of row address signals, the first subset of the set of row address signals carrying the identifying code that identifies which portion among the plurality of portions of the bi-dimensional array the defective column belongs; and activating one signal among a second subset of row address signals to select one non-volatile memory register of said plurality of non-volatile memory registers such that the defective column address and the identifying code are programmed into the selected memory register.

2. Column redundancy integrated circuitry for a semiconductor memory device with memory elements located at the intersection of rows and columns of at least one bi-dimensional array of memory elements, the columns being grouped together to form a plurality of portions of the bi-dimensional array, including at least one plurality of non-volatile memory registers with each non-volatile memory register being associated with a respective redundancy column of redundancy memory elements and each non-volatile memory register being programmable to store an address of a defective column and to store an identifying code for identifying the portion of the bi-dimensional array to which the defective column belongs, the circuitry comprising:

first supply means for supplying each non-volatile memory register with column address signals carrying a defective column address;

second supply means for supplying each non-volatile memory reister with a first subset of a set of row address signals, the first subset of the set of row address signals carrying the identifying code that identifies which portion among the plurality of portions of the bi-dimensional array the defective column belongs; and programming selection means, coupled to the non-volatile memory registers, adapted to receive a second subset of the set of row address signals, each signal of said second subset being associated with a respective non-volatile memory register of said at least one plurality of non-volatile memory registers, the programming selection means being responsive to the second subset of the set of row address signal to select one non-volatile memory register such that the defective column address and the identifying code supplied by the first and second supply means, respectively, are programmed into the selected non-volatile memory register.

3. Column redundancy integrated circuitry according to claim 2, wherein each non-volatile memory register comprises:

a first set of non-volatile memory cells each supplied with a respective column address signal, and a second set of non-volatile memory cells each supplied with a respective signal of the first subset of row address signals, each memory cell comprising at least one programmable non-volatile memory element, a load circuit for reading the information stored in said non-volatile memory element, and a programming load circuit for electrically connecting said non-volatile memory element to the respective column address signal or to the respective signal of the first subset of row address signals when the non-volatile memory register is to be programmed.

4. Column redundancy integrated circuitry according to claim 3, wherein said programming load circuit comprises a switch connected between one of said column address signals or one signal of the first subset of row address signals and a supply electrode of the respective non-volatile memory element, and controlled by a program enable signal that is activated during programming by said programming selection means when the respective signal of the second subset of row address signals is activated.

5. Column redundancy integrated circuitry according to claim 2 wherein the memory device comprises a plurality of bi-dimensional arrays of memory elements constituting individually addressable sectors of a matrix of memory elements, each sector being provided with a plurality of redundancy columns associated with a respective plurality of non-volatile memory registers, wherein said programming selection means further includes sector selection signals for the selection of the plurality of non-volatile memory registers to which a non-volatile memory register to be programmed belongs.

6. Column redundancy circuitry for a semiconductor memory device having memory elements located at the intersection of rows and columns of a bi-dimensional array of memory elements, the columns being grouped together to form a plurality of portions of the bi-dimensional array, the circuitry comprising:

a column address bus comprised of a plurality of column address signals;

a redundancy register having a first sub-register and a second sub-register, the first sub-register of the redundancy register having a first plurality of inputs, each of the first plurality of inputs being coupled to a respective column address signal, each respective column address signal being from among the plurality of column address signals, and the second sub-register of the redundancy register having a second plurality of inputs; and a row address bus comprised of a plurality of row address signals, the plurality of row address signals comprising a grouping of row address signals, each of the plurality of row address signals that comprise the grouping of row address signals being coupled to a respective input, from among the second plurality of inputs, of the second sub-register of the redundancy register.

7. The circuitry of claim 6 wherein the plurality of row address signals further comprises an additional row address signal that is not one of the row address signals that comprise the grouping of row address signals, and wherein the first and second sub-registers of the redundancy register further comprise a program enable input, the circuitry further comprising:

a redundancy register program enable signal; and a program selection circuit having a first input, a second input, and an output, the first input being coupled to the additional row address signal, the second input being coupled to the redundancy register program enable signal, and the output being coupled to the program enable inputs of the first and the second sub-registers of the redundancy register.

8. The circuitry of claim 7 wherein the output of the program selection circuit is coupled to the program enable inputs of the first and the second sub-registers of the redundancy register via a switch.

9. The circuitry of claim 6 wherein the first sub-register of the redundancy register further comprises:

a, first plurality of programmable non-volatile memory cells, each programmable non-volatile memory cell having a programming data line and an output signal line, each programming data line constituting one of the first plurality of inputs of the first sub-register of the redundancy register;

for each of the first plurality of programmable non-volatile memory cells, a comparison circuit having a first input, a second input, and an output, the first input being coupled to the programming data line of the programmable non-volatile memory cell and the second input being coupled to the output signal line of the programmable non-volatile memory cell; and a redundancy bit selection circuit having a plurality of inputs and an output, each of the plurality of inputs of the redundancy bit selection circuit being coupled to a respective output of one of the comparison circuits.

10. The circuitry of claim 9 wherein the second sub-register of the redundancy register further comprises:

a first identifying code bus comprised of a first plurality of identifying code signals; and a, second plurality of programmable non-volatile memory cells, each programmable non-volatile memory cells having a programming data line and an output signal line, each programming data line constituting one of the second plurality of inputs of the second sub-register of the redundancy register and each output signal line being coupled to a respective identifying code signal from among the first plurality of identifying code signals that comprise the first identifying code bus.

11. The circuitry of claim 10, further comprising:

a multiple switch having a control terminal, a plurality of inputs, and a plurality of outputs, the control terminal being coupled to the output of the redundancy bit selection circuit, each of the plurality of inputs being coupled to one of the respective identifying code signals that comprise the first identifying code bus; and a second identifying code bus being comprised of a second plurality of identifying code signals, each of the second plurality of identifying code signals being coupled to a respective output, from among the plurality of outputs, of the multiple switch.

12. The circuitry of claim 6 wherein the second sub-register of the redundancy register further comprises:

a first identifying code bus comprised of a first plurality of identifying code signals; and a plurality of programmable non-volatile memory cells, each programmable non-volatile memory cell having a programming data line and an output signal line, each programming data line constituting one of the second plurality of inputs of the second sub-register of the redundancy register and each output signal line being coupled to a respective identifying code signal from among the first plurality of identifying code signals that comprise the first identifying code bus.

13. A column redundancy circuitry for a semiconductor memory device having memory elements located at the intersection of rows and columns of a bi-dimensional array of memory elements, the columns being grouped together to form a plurality of portions of the bi-dimensional array, the circuitry comprising:

a column address bus having a plurality of column address lines for carrying a defective column address;

a row address bus having first and second plurality of row address lines, the first plurality of row address lines for carrying an identifying code that identifies which portion among the plurality of portions of the bi-dimensional array the defective column belongs;

at least one redundancy register having a first sub-register and a second sub-register, the first sub-register having a first plurality of inputs, each of the first plurality of inputs being connected to a respective column address line of the plurality of column address lines, the second sub-register having a second plurality of inputs, each of the second plurality of inputs being connected to a respective row address line of the first plurality of row address lines;

programming selection circuit connected to the redundancy register and having an input connected to at least one row address line of the second plurality of row address lines, the programming selection circuit being responsive to the at least one row address line of the second plurality of row address lines to select the redundancy register such that the defective column address carried by the plurality of column address lines and the identifying code carried by the first plurality of row address lines are programmed into the selected redundancy register.

14. The column redundancy circuitry according to claim 13 wherein the at least one redundancy register includes a plurality of redundancy registers and the input of the programming selection circuit is connected to the second plurality of row address lines, each row address line of the second plurality of row address lines being associated with a respective redundancy register of the plurality of redundancy registers, the programming selection circuit being responsive to the second plurality of row address lines to select one redundancy register among the plurality of redundancy registers such that the defective column address and the identifying code are programmed into the selected redundancy register.

15. A column redundancy circuitry for a semiconductor memory device having memory elements located at the intersection of rows and columns of a bi-dimensional array of memory elements, the columns being grouped together to form a plurality of portions of the bi-dimensional array, the circuitry comprising:

a column address bus having a plurality of column address lines for carrying an address of a defective column;

a row address bus having a first plurality of row address lines, the first plurality of row address lines for carrying an identifying code that identifies which portion among the plurality of portions of the bi-dimensional array the defective column belongs; and a non-volatile memory register including:

at least one first redundancy register having a plurality of inputs with each input being connected to a respective column address line of the column address bus; and at least one second redundancy register having a first plurality of inputs, each of the first plurality of inputs being connected to a respective row address line of the first plurality of row address lines.

16. The column redundancy circuitry according to claim 15 wherein the row address bus includes a second plurality of row address lines, the column redundancy circuitry further comprising a programming selection circuit connected to the first and second redundancy registers and having an input connected to at least one row address line of the second plurality of row address lines, the programming selection circuit being responsive to the at least one row address line of the second plurality of row address lines to select the first and second redundancy registers such that the defective column address carried by the plurality of column address lines and the identifying code carried by the first plurality of row address lines are programmed into the selected first and second redundancy registers.

17. The column redundancy circuitry according to claim 16 wherein the at least one first and second redundancy registers include a plurality of first and second redundancy registers and the input of the programming selection circuit is connected to the second plurality of row address lines, each row address line of the second plurality of row address lines being associated with a respective pair of first and second redundancy registers among the plurality of first and second redundancy registers, the programming selection circuit being responsive to the second plurality of row address lines to select one pair of first and second redundancy registers among the plurality of first and second redundancy registers such that the defective column address and the identifying code are programmed into the selected first and second redundancy registers.

* * * * *

UNITED STATES PATENT AND TRADEMARK OFFICE
CERTIFICATE OF CORRECTION

PATENT NO.     : 5,602,786
DATED          : February 11, 1997
INVENTOR(S)    : Luigi Pascucci et al.

It is certified that error appears in the above identified patent and that said Letters Patent is hereby corrected as shown below:

On the title page in field [75] denoting the Inventors, please delete "Giovanni" and insert therefor --Sesto San Giovanni --.

In column 10, claim 9, line 60, please delete ",".

In column 11, claim 10, line 14, please delete ",".

In column 11, claim 10, line 15, please delete the second instance of "cells" and insert therefor --cell--.

Signed and Sealed this

Thirtieth Day of September, 1997

Attest:

BRUCE LEHMAN

*Attesting Officer*      *Commissioner of Patents and Trademarks*